(12) United States Patent
Lo et al.

(10) Patent No.: US 12,204,247 B2
(45) Date of Patent: Jan. 21, 2025

(54) LITHOGRAPHY FILM STACK AND LITHOGRAPHY METHOD

(71) Applicant: United Semiconductor (Xiamen) Co., Ltd., Fujian (CN)

(72) Inventors: Ching-Shu Lo, Singapore (SG); Yuan-Chi Pai, Fujian (CN); Maohua Ren, Fujian (CN); Wen Yi Tan, Fujian (CN)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 226 days.

(21) Appl. No.: 18/107,518

(22) Filed: Feb. 9, 2023

(65) Prior Publication Data

US 2024/0201598 A1 Jun. 20, 2024

(30) Foreign Application Priority Data

Dec. 14, 2022 (CN) .......................... 202211606343.3

(51) Int. Cl.
G03F 7/20 (2006.01)
G03F 7/00 (2006.01)

(52) U.S. Cl.
CPC .......... *G03F 7/2041* (2013.01); *G03F 7/0035* (2013.01); *G03F 7/2004* (2013.01); *G03F 7/70308* (2013.01)

(58) Field of Classification Search
CPC .... G03F 7/0035; G03F 7/2004; G03F 7/2041; G03F 7/70308; G03F 7/11; G03F 7/70341
See application file for complete search history.

(56) References Cited

U.S. PATENT DOCUMENTS

| | | | |
|---|---|---|---|
| 2022/0204745 A1* | 6/2022 | Aritoshi | C08K 7/18 |
| 2023/0185193 A1* | 6/2023 | Cao | G03F 7/095 |
| | | | 430/30 |
| 2023/0185201 A1* | 6/2023 | Cao | G03F 7/168 |
| | | | 355/67 |

* cited by examiner

*Primary Examiner* — Deoram Persaud
(74) *Attorney, Agent, or Firm* — Winston Hsu

(57) ABSTRACT

A lithography film stack applied to an immersion lithography process includes a photoresist, a wavelength adjusting layer and a top coating layer. The photoresist is disposed on a substrate. The wavelength adjusting layer is disposed on the photoresist. The top coating layer is disposed on the wavelength adjusting layer. A refractive index of the wavelength adjusting layer is greater than a refractive index of the top coating layer and a refractive index of an immersion fluid of the immersion lithography process.

20 Claims, 2 Drawing Sheets

LITHOGRAPHY FILM STACK AND LITHOGRAPHY METHOD

BACKGROUND OF THE INVENTION

1. Field of the Invention

The present disclosure relates to the field of semiconductor devices, and more particularly, to a lithography film stack and a lithography method using the same.

2. Description of the Prior Art

In order to reduce the production cost and improve the competitive advantage, the desired dimension of semiconductor devices is shrinking. The lithography process is related to the critical dimension (CD) of the semiconductor device. The lithography process of semiconductor includes a dry lithography and an immersion lithography. As for the dry lithography, air is used as the medium between the lens and the wafer. As for the immersion lithography, water is used as the medium between the lens and the wafer. Compared with air, water has a larger refractive index. Therefore, it is beneficial to increase the numerical aperture (NA) of the lens and improve the resolution and depth of focus by using water as the medium. As a result, the line width of semiconductor can be reduced from 65 nm to 45 nm.

However, with the desired dimension of the semiconductor device continuously shrinking, how to further reduce the line width of semiconductor is the goal of the semiconductor industry.

SUMMARY OF THE INVENTION

According to one aspect of the present disclosure, a lithography film stack applied to an immersion lithography process includes a photoresist, a wavelength adjusting layer and a top coating layer. The photoresist is disposed on a substrate. The wavelength adjusting layer is disposed on the photoresist. The top coating layer is disposed on the wavelength adjusting layer. A refractive index of the wavelength adjusting layer is greater than a refractive index of the top coating layer and a refractive index of an immersion fluid of the immersion lithography process.

According to another aspect of the present disclosure, a lithography method includes steps as follows. A photoresist is formed on a substrate. A wavelength adjustment layer is formed on the photoresist. A top coating layer is formed on the wavelength adjustment layer. An immersion fluid is provided between the top coating layer and a lens of an exposure device, wherein a refractive index of the wavelength adjusting layer is greater than a refractive index of the top coating layer and a refractive index of the immersion fluid. An exposure and development step is performed to transfer a pattern of a photomask to the photoresist.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the embodiments, reference is made to the accompanying drawings which form a part thereof, and in which is shown by way of illustration specific embodiments in which the disclosure may be practiced. In this regard, directional terminology, such as up, down, left, right, front, back, bottom or top is used with reference to the orientation of the Figure (s) being described. The elements of the present disclosure can be positioned in a number of different orientations. As such, the directional terminology is used for purposes of illustration and is in no way limiting. In addition, identical numeral references or similar numeral references are used for identical elements or similar elements in the following embodiments.

Hereinafter, for the description of "the first feature is formed on or above the second feature", it may refer that "the first feature is in contact with the second feature directly", or it may refer that "there is another feature between the first feature and the second feature", such that the first feature is not in contact with the second feature directly.

Figure 1:
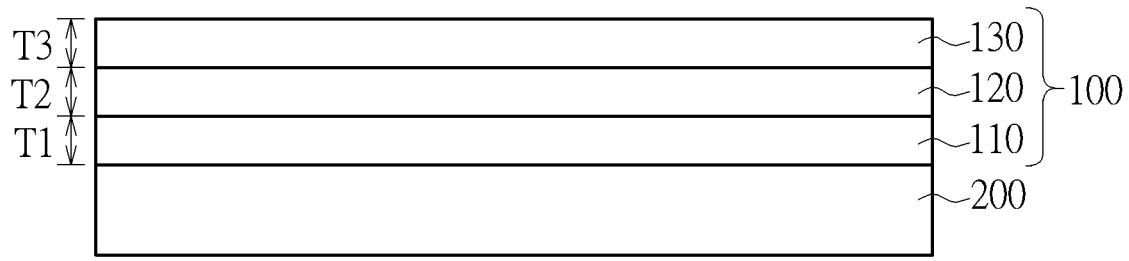
FIG. 1 is a schematic cross-sectional view of a lithography film stack according to one embodiment of the present disclosure.

Please refer to FIG. 1, which is a schematic cross-sectional view of a lithography film stack 100 according to one embodiment of the present disclosure. The lithography film stack 100 is configured to be applied to an immersion lithography process, and the lithography film stack 100 is configured to be formed on a substrate 200. The lithography film stack 100 includes a photoresist 110, a wavelength adjusting layer 120 and a top coating layer 130. The photoresist 110 is disposed on the substrate 200. The wavelength adjusting layer 120 is disposed on the photoresist 110. The top coating layer 130 is disposed on the wavelength adjusting layer 120. A refractive index of the wavelength adjusting layer 120 is greater than a refractive index of the top coating layer 130 and a refractive index of an immersion fluid (such as the immersion fluid F in FIG. 3) of the immersion lithography process. Thereby, a wavelength of lights (such as the lights L in FIG. 3) of an exposure source (such as the exposure source 430 in FIG. 3) is shortened when the lights enter into the wavelength adjusting layer 120 from the immersion fluid (that is, the wavelength of the lights in the wavelength adjusting layer 120 is shorter than the wavelength of the lights in the immersion fluid), which is beneficial to improve resolution.

The substrate 200 may be a semiconductor substrate, such as a silicon substrate, an epitaxial silicon substrate, a silicon carbide substrate, or a silicon on insulator (SOI) substrate. For example, the substrate 200 may be a semiconductor wafer, but the present disclosure is not limited thereto.

A refractive index of the photoresist 110 can be equal to or greater than 1.9. Alternatively, the refractive index of the photoresist 110 can be equal to or greater than 2. A thickness T1 of the photoresist 110 is related to the penetration depth of the exposure source. When the thickness T1 of the photoresist 110 is smaller than the penetration depth of the exposure source, the exposure can be more homogeneous. When the thickness T1 of the photoresist 110 is greater than the penetration depth of the exposure source, only an upper portion of the photoresist 110 absorbs energy at the beginning of the exposure, so that a certain dose of energy is required to fully expose the entire photoresist 110. In other words, the thickness T1 of the photoresist 110 can be adjusted according to the penetration depth of the exposure source. According to one embodiment of the present disclosure, the thickness T1 of the photoresist 110 may be 500 angstroms to 1000 angstroms. Thereby, it is beneficial to improve the resolution. The material of the photoresist 110 may include, but is not limited to, a chemical amplification photoresist. For example, the components of the photoresist 110 may include a polymer, a solvent, a photoacid generator and an alkali inhibitor. In the present disclosure, the refractive index of the photoresist 110 can be adjusted to be greater than or equal to 1.9 by selecting the polymer, the monomer forming the polymer and/or adding nanoparticles with a high refractive index into the polymer. For example, the polymer can be an intrinsic high refractive index polymer (intrinsic HRIP), or the polymer can be an HRIP nanocomposite formed by nanoparticles with a high refractive index and a polymer matrix.

The refractive index of the wavelength adjusting layer 120 can be equal to or greater than 1.9. Alternatively, the refractive index of the wavelength adjusting layer 120 can be equal to or greater than 2. Thereby, when the lights of the exposure source enter into the wavelength adjusting layer 120 from the immersion fluid, the wavelength of the lights can be shortened more significantly, which can further improve the resolution. The refractive index of the wavelength adjusting layer 120 can be identical to the refractive index of the photoresist 110. Thereby, the wavelength of the lights of the exposure source can be maintained when the lights enter into the photoresist 110 from the wavelength adjusting layer 120 (that is, the wavelength of the lights in the wavelength adjusting layer 120 is equal to the wavelength of the lights in photoresist 110). A thickness T2 of the wavelength adjusting layer 120 may be 500 angstroms to 1000 angstroms. Thereby, it is beneficial to improve the resolution. The wavelength adjusting layer 120 is not sensitive or responsive to the lights of the exposure source. The components of the wavelength adjusting layer 120 can include a polymer and a solvent, and does not include a photosensitive component. In the present disclosure, the refractive index of the wavelength adjusting layer 120 can be adjusted to be greater than the refractive index of top coating layer 130 and the refractive index of immersion fluid or to be greater than or equal to 1.9 by selecting the polymer, the monomer forming the polymer and/or adding nanoparticles with a high refractive index into the polymer. For example, the polymer can be an intrinsic HRIP, or the polymer can be an HRIP nanocomposite formed by nanoparticles with a high refractive index and a polymer matrix. According to one embodiment of the present disclosure, the material of the photoresist 110 removing the photosensitive component can be used as the material of the wavelength adjusting layer 120. Thereby, the main components (such as the polymer) of the photoresist 110 and the wavelength adjusting layer 120 are the same, which is beneficial to improve the adhesion between the photoresist 110 and the wavelength adjusting layer 120.

The refractive index of the top coating layer 130 can be between the refractive index of the immersion fluid and the refractive index of the photoresist 110. A thickness T3 of the top coating layer 130 can be 300 angstroms to 700 angstroms. Alternatively, the thickness T3 of the top coating layer 130 can be 500 angstroms. Thereby, it is beneficial to improve the resolution. The top coating layer 130 is insoluble in the immersion fluid. Thereby, it can prevent the components of the photoresist 110 and the wavelength adjusting layer 120 from diffusing into the immersion fluid. Accordingly, it can avoid from contaminating the exposure device and can reduce the probability of exposure failures (such as overlay variation). The top coating layer 130 can be dissolved in a developer, an alkaline solution or a solvent. Thereby, it is beneficial to remove the top coating layer 130 after the exposure is completed. The material of the top coating layer 130 is well known in the art, and is not repeated herein.

Figure 2:
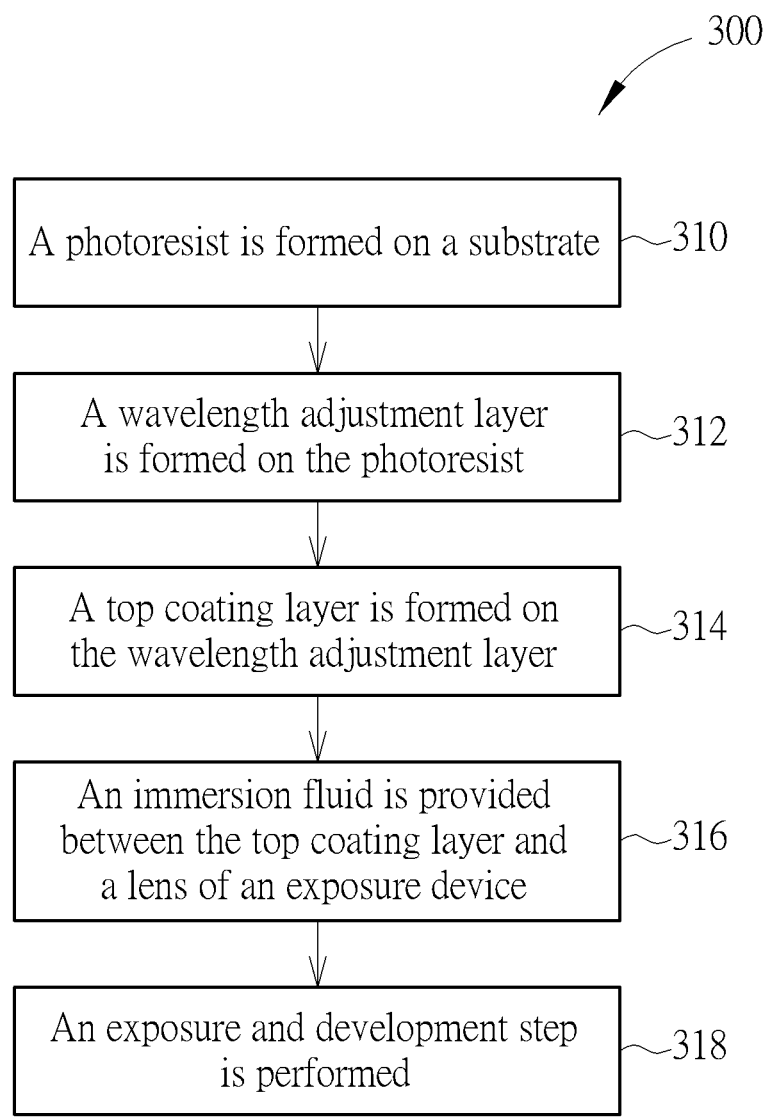
FIG. 2 is a flow diagram showing a lithography method according to one embodiment of the present disclosure.

Please refer to FIG. 2, which is a flow diagram showing a lithography method 300 according to one embodiment of the present disclosure. The lithography method 300 includes Step 310 to Step 318. In Step 310, a photoresist is formed on a substrate. The photoresist can be formed on the substrate by spin coating. After the coating is completed, the photoresist can be soft baked to remove the residual moisture and solvent in the photoresist, so that the photoresist becomes a solid film. For details of the substrate and the photoresist, reference may be made to the above descriptions related to the substrate 200 and the photoresist 110.

In Step 312, a wavelength adjustment layer is formed on the photoresist. The wavelength adjustment layer can be formed on the photoresist by spin coating. After the coating is completed, the wavelength adjustment layer can be baked, so that the wavelength adjustment layer becomes a solid film. For details of the wavelength adjustment layer, reference may be made to the above descriptions related to the wavelength adjustment layer 120. In the present disclosure, the photoresist is soft baked before forming the wavelength adjusting layer, which is beneficial to clearly define the wavelength adjusting layer and the photoresist to prevent the exposure failure caused by the mixture of the components of the wavelength adjusting layer and the photoresist.

In Step 314, a top coating layer is formed on the wavelength adjustment layer. The top coating layer can be formed on the wavelength adjustment layer by spin coating. After the coating is completed, the top coating layer can be baked to become a solid film. Thereby, the lithography film stack can be formed or disposed on the substrate. For details of the top coating layer, reference may be made to the above descriptions related to the top coating layer 130.

In Step 316, an immersion fluid is provided between the top coating layer and a lens of an exposure device, wherein a refractive index of the wavelength adjusting layer is greater than a refractive index of the top coating layer and a refractive index of the immersion fluid.

In Step 318, an exposure and development step is performed to transfer a pattern of a photomask to the photoresist.

Figure 3:
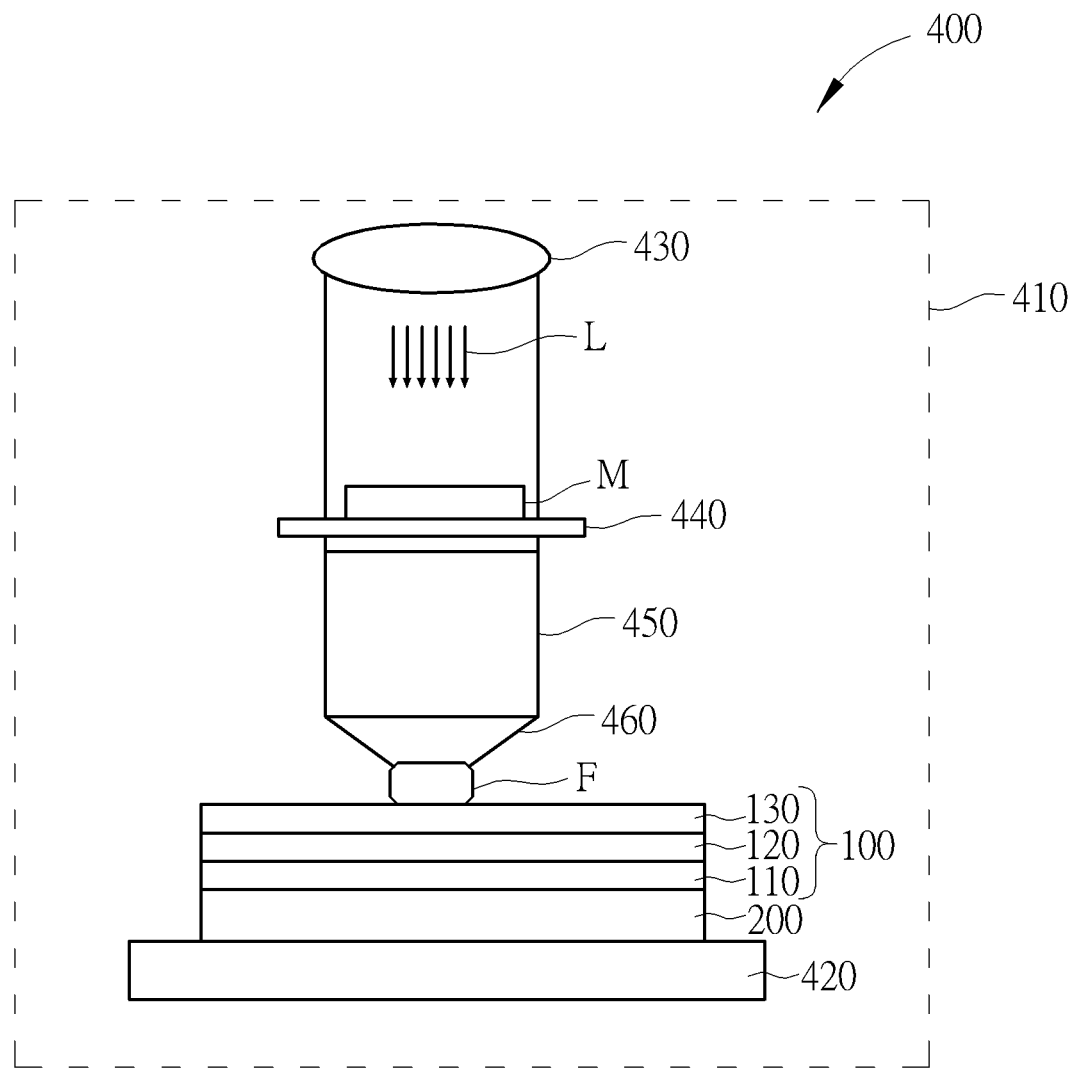
FIG. 3 is a schematic diagram showing an arrangement of a lithography film stack and an exposure device according to one embodiment of the present disclosure.

Please refer to FIG. 3, which is a schematic diagram showing an arrangement of the lithography film stack 100 and an exposure device 400 according to one embodiment of the present disclosure. The Exposure device 400 can provide various exposure modes, such as a step exposure mode, a scan exposure mode or a step and scan exposure mode. The exposure device 400 may include a chamber 410, a carrier 420, an exposure source 430, a photomask platform 440, a projection lens 450 and a bottom lens 460. The chamber 410 can be configured to isolate external pollutants. The carrier 420 can be configured to carry the substrate 200 and the lithography film stack 100. The exposure source 430 can be configured to provide lights L to the substrate 200 and the lithography film stack 100. The photomask platform 440 can be configured to carry a photomask M. The photomask M is formed with a pattern (not shown) to be transferred to the substrate 200. The projection lens 450 and the bottom lens 460 are configured to enlarge or reduce the projection size of the pattern on the substrate 200 and lithography film stack 100. The projection lens 450 may include one or more lenses. The immersion fluid F is provided between the top coating layer 130 of the lithography film stack 100 and the bottom lens 460. Other optical components (not shown), such as one or more condensing lenses and slits, may be further included between the exposure source 430 and the photomask platform 440 to adjust the optical paths of the lights L.

The exposure source 430 may be a deep ultraviolet (DUV) light source. For example, the exposure source 430 may be a krypton fluoride (KrF) excimer laser, which can emit lights with a wavelength of about 248 nm. For another example, the exposure source 430 may be an argon fluoride (ArF) excimer laser, which can emit lights with a wavelength of 193 nm, but the present disclosure is not limited thereto. In some embodiments, the exposure source 430 may be an ultraviolet (UV) source or an extreme ultraviolet (EUV) light source.

The immersion fluid F may be water such as deionized water. Because water has a low absorptivity and high transmittance to the lights L of the exposure source 430, the exposure efficiency is not easily reduced, and the probability of contaminating the exposure device 400 can be reduced. However, the present disclosure is not limited thereto. The immersion fluid F can be other liquid with a refractive index higher than that of air and having low absorptivity and high transmittance to lights L.

In other words, according to the lithography method 300 of the present disclosure, the lithography film stack 100 can be formed on the substrate 200 via Steps 310, 312 and 314 by using other devices such as a spin coater (not shown), and then the substrate 200 and the lithography film stack 100 are placed on the carrier 420 in the chamber 410 of the exposure device 400 to perform Step 316 and the exposure part of Step 318. Then the development part of Step 318 is performed by using other device such as a development device (not shown). Moreover, a post-exposure baking may be optionally performed after the exposure part of Step 318 and before the development part of Step 318 to rearrange the molecular structure of the photoresist 110 to reduce the stationary wave effect. As shown in FIG. 3, in the present disclosure, not only the immersion fluid F is used to replace air to be the medium between the bottom lens 460 and top coating layer 130, but also the wavelength adjusting layer 120 is disposed between the top coating layer 130 and photoresist 110. Based on the arrangement of the refractive indexes of the immersion fluid F and the wavelength adjusting layer 120, when the lights L of the exposure source 430 enter into the immersion fluid F from the bottom lens 460, the wavelength of the lights L is shortened compared with that when the lights L enter into air from the bottom lens 460 (that is, the wavelength of the lights L in the immersion fluid F is shorter than the wavelength of the lights L in air). When the lights L from the immersion fluid F pass through the top coating layer 130 to enter into the wavelength adjusting layer 120, the wavelength of the lights L can be further shortened, which can further improve the resolution and facilitate the reduction the line width of semiconductor devices. According to one embodiment of the present disclosure, the refractive index of the bottom lens 460 is 1.56, the refractive index of water (the immersion fluid F) is 1.436, the refractive index of the top coating layer 130 is 1.5, the refractive index of the wavelength adjusting layer 120 is 1.9, and the refractive index of the photoresist 110 is 1.9. When the wavelength of the lights L of the exposure source 430 is 193 nm, the wavelength of the lights L in water is reduced to about 134 nm, and the wavelength of the lights L in the wavelength adjusting layer 120 is further reduced to about 102 nm. In addition, as shown in FIG. 3, the lithography method 300 of the present disclosure can directly use the existing exposure device 400 for exposure, there is no need to purchase or design a new exposure device 400. Accordingly, the lithography method 300 of the present disclosure has advantages of convenience and reduced cost.

Compared with the prior art, in the present disclosure, with the wavelength adjusting layer being disposed on the photoresist and the wavelength adjusting layer having the refractive index being greater than that of the top coating layer and the immersion fluid, the wavelength of the lights of the exposure source is shortened when the lights enter into the wavelength adjusting layer from the immersion fluid, which is beneficial to improve the resolution.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A lithography film stack, applied to an immersion lithography process, the lithography film stack comprising:
    a photoresist disposed on a substrate;
    a wavelength adjusting layer disposed on the photoresist; and
    a top coating layer disposed on the wavelength adjusting layer, wherein a refractive index of the wavelength adjusting layer is greater than a refractive index of the top coating layer and a refractive index of an immersion fluid of the immersion lithography process.

2. The lithography film stack of claim 1, wherein the refractive index of the wavelength adjusting layer is identical to a refractive index of the photoresist.

3. The lithography film stack of claim 1, wherein the refractive index of the top coating layer is between the refractive index of the immersion fluid and a refractive index of the photoresist.

4. The lithography film stack of claim 1, wherein the refractive index of the wavelength adjusting layer is equal to or greater than 1.9.

5. The lithography film stack of claim 1, wherein a refractive index of the photoresist is equal to or greater than 1.9.

6. The lithography film stack of claim 1, wherein the immersion fluid is water.

7. The lithography film stack of claim 1, wherein an exposure source of the immersion lithography process is a deep ultraviolet light source.

8. The lithography film stack of claim 1, wherein a thickness of the wavelength adjusting layer is 500 angstroms to 1000 angstroms.

9. The lithography film stack of claim 1, wherein a thickness of the photoresist is 500 angstroms to 1000 angstroms.

10. The lithography film stack of claim 1, wherein a thickness of the top coating layer is 300 angstroms to 700 angstroms.

11. A lithography method, comprising:
    forming a photoresist on a substrate;
    forming a wavelength adjustment layer on the photoresist;
    forming a top coating layer on the wavelength adjustment layer;

providing an immersion fluid between the top coating layer and a lens of an exposure device, wherein a refractive index of the wavelength adjusting layer is greater than a refractive index of the top coating layer and a refractive index of the immersion fluid; and performing an exposure and development step to transfer a pattern of a photomask to the photoresist.

12. The lithography method of claim 11, wherein the refractive index of the wavelength adjusting layer is identical to a refractive index of the photoresist.

13. The lithography method of claim 11, wherein the refractive index of the top coating layer is between the refractive index of the immersion fluid and a refractive index of the photoresist.

14. The lithography method of claim 11, wherein the refractive index of the wavelength adjusting layer is equal to or greater than 1.9.

15. The lithography method of claim 11, wherein a refractive index of the photoresist is equal to or greater than 1.9.

16. The lithography method of claim 11, wherein the immersion fluid is water.

17. The lithography method of claim 11, wherein an exposure source of the exposure device is a deep ultraviolet light source.

18. The lithography method of claim 11, wherein a thickness of the wavelength adjusting layer is 500 angstroms to 1000 angstroms.

19. The lithography method of claim 11, wherein a thickness of the photoresist is 500 angstroms to 1000 angstroms.

20. The lithography method of claim 11, wherein a thickness of the top coating layer is 300 angstroms to 700 angstroms.

* * * * *